United States Patent
Piret et al.

(10) Patent No.: US 6,393,065 B1
(45) Date of Patent: May 21, 2002

(54) CODING AND DECODING METHODS AND DEVICES AND EQUIPMENT USING THEM

(75) Inventors: Philippe Piret, Cesson-Sevigne; Claude Le Dantec, Saint-Hilaire des Landes, both of (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/141,589

(22) Filed: Aug. 28, 1998

(30) Foreign Application Priority Data

Aug. 29, 1997 (FR) ............................................ 97 10808

(51) Int. Cl.[7] .............................................. H04L 5/12
(52) U.S. Cl. ....................................................... 375/261
(58) Field of Search ............................... 375/261, 259; 714/6, 784; 341/51, 52, 94, 106, 107

(56) References Cited

U.S. PATENT DOCUMENTS

| | | | |
|---|---|---|---|
| 4,486,882 A | | 12/1984 | Piret et al. ........................ 371/45 |
| 4,856,003 A | * | 8/1989 | Weng ............................. 714/784 |
| 5,150,381 A | * | 9/1992 | Forney, Jr. et al. ............ 375/261 |
| 5,487,077 A | * | 1/1996 | Hassner et al. ................. 714/762 |
| 5,644,695 A | * | 7/1997 | Blaum et al. ...................... 714/6 |
| 6,263,470 B1 | * | 7/2001 | Hung et al. .................... 714/784 |

FOREIGN PATENT DOCUMENTS

| | | |
|---|---|---|
| EP | 290 349 | 11/1988 |
| EP | 383 632 A3 | 8/1990 |
| EP | 472 460 | 2/1992 |

OTHER PUBLICATIONS

French Official Search Report dated May 29, 1998.
Sun et al., "Codage pour modulation d'amplitude en quadrature á grand nombre détats avec partition á pulsieurs niveaux", Ann Telecommun., 46 No. 7–8, (pp. 434–442) 1991.
Couvreur and Piret, "Codes Between BCH and RS Codes", Philips Journal of Research, vol. 39, Numbers 4/5 1984 (pp. 195–205), 1984.

* cited by examiner

Primary Examiner—Don N. Vo
(74) Attorney, Agent, or Firm—Fitzpatrick, Cella, Harper & Scinto

(57) ABSTRACT

A coding device that supplied code words, the symbols of which are capable of modulating a physical quantity on a transmission channel making use of symbols of a first alphabet. The decoding of these words uses symbols of a second alphabet containing the first alphabet, the cardinal of the second alphabet being strictly greater than that of the first alphabet and not being an integer power of the cardinal of the first alphabet. The coding device has an input of the "primary" symbols belonging to the first alphabet, a processor which determines redundant symbols capable of allowing decoding of the code words formed from primary symbols and redundant symbols, by a decoder working on the second alphabet, and solves a system of equations expressing the constraints to be met so that the redundant symbols are in the first alphabet, and an output of the symbols of the code words.

36 Claims, 4 Drawing Sheets

CODING AND DECODING METHODS AND DEVICES AND EQUIPMENT USING THEM

BACKGROUND OF THE INVENTION

1. Field of the Invention

The present invention concerns a coding method and device, a decoding method and device, and equipment using them. In particular the invention aims to generate code words belonging to a Reed-Solomon code on a Galois field having q elements, the code words generated having all their symbols in a sub-alphabet of this Galois field.

2. Description of the Background

This method is Particularly applied to Reed-Solomon codes on a 256-element Galois field and a sub-alphabet of this field having 64 elements.

Maximum distance separable codes constitute a particularly interesting family of error correction codes. These codes are defined on an alphabet F provided with a Galois field structure GF(q) where q is a power of a prime number p.

Like all linear codes, maximum distance separable codes can be defined by a generator matrix or a control matrix. Known constructions for such matrices effectively corresponding to maximum distance separable codes are the so-called Vandermonde construction or that of Cauchy [Mac Williams and Sloane].

The actual use of a code requires the use of a coder, that is to say a device which, for a code of type (n,k), maps, to each k-tuple of units of information $u=(u_1, \ldots, u_k)$ on GF(q), a coded n-tuple $v=(v_1, \ldots, v_n)$, referred to as a "coded word", which represents and which is transmitted in its place. From this point of view, a distinction: between systematic coders and non-systematic coders is established. A coder is referred to as systematic if the k components $u_1$ of u appear unmodified as a component $v_{j(l)}$ of the coded word v representing u.

It should be noted that if $k \geq 4$ or $k \leq n-4$, maximum distance separable codes on GF(q) are known only for $n \geq q+1$, and that the case $n=q-1$ is of particular interest. There are, on the electronic component market, many decoders decoding maximum distance separable codes and operating on an alphabet with 256 elements, each of these elements being identified with a different binary octet, and the said alphabet being structured as the Galois field having 256 elements and often denoted GF(256).

For the remote transmission of information, quadrature amplitude modulations allow a high transmission rate. These modulations have, for example, a 64-signal constellation, such that each of the two components carried by the phase quadrature amplitudes can take eight different values. The natural alphabet associated with this type of modulation therefore has 64 elements.

Persons skilled in the art who wish to use 64-element quadrature amplitude modulation are first of all tempted to use a Reed-Solomon code defined on a 64-element Galois field. However the number of symbols in the code words is limited to 65, which may be too low for certain applications.

A code known to persons skilled in the art under the name BCH defined on the 64-element Galois field can also be used. However, this implies that the decoder works on an alphabet with $2^{12}=4096$ elements, which is not implemented in a conventional technology. Furthermore, for a given correction capability, the redundancy is then most often close to twice what it is in the case of Reed-Solomon codes, since on GF(64), $x^{4095}-1$ factorises into the product of 63 first degree polynomials and 2016 irreducible second degree polynomials.

BRIEF SUMMARY OF THE INVENTION

The present invention intends notably to specify a systematic procedure for encoding sequences of binary information such that the words of the code are words of a maximum distance separable code on the 256-element Galois field, referred to as the "second alphabet", and, in addition, satisfy the condition that only 64 of the 256 symbols of this alphabet can be used, both as redundant symbols and as information symbols. The 64 symbols of the second alphabet which are used in this way are called the "first alphabet".

Thus the decoder can be implemented with a commercial component already produced, at the date of the invention, in large quantities and, consequently, of low cost, while using a transmission channel with quadrature amplitude modulations having 64 elements.

For a given correction capability, the redundancy necessary will then be equal to four thirds of that necessary with a Reed-Solomon code using a 256-element alphabet.

The document EP-0 290 349 (Weng Lih-Jih) is known. In this, given a 256-element sub-alphabet of a 1024-element Galois field, each unit of information to be encoded is represented by k-l symbols of the sub-alphabet to which l arbitrary units of pseudo-information are added, testing the sequences of l arbitrary units of information until the code words contain only symbols of the sub-alphabet, the number l being chosen with the aim that at least one such sequence gives the result sought.

The aim of this document EP-0 290 349 is to keep an octet format for the information and the redundancies, and to construct efficient error correction codes with little redundancy, for encoding long sequences of information.

The document EP-0 290 349 has many drawbacks: it does not suggest using a decoder working on a 256-element Galois field, determination of the units of pseudo-information is not optimised, the number of these units of pseudo-information is not known when the search for them is started, and the said search is empirical and based on a series of tests and checks. The successive test procedures to be used for determining the sequence of l units of pseudo-information are lengthy and they therefore do not allow rapid encoding of the information. Another embodiment disclosed by the document EP-0 290 349 presents the use of a look-up table, which implies the use of a read-only memory whose capacity, at the date of the present invention, is impracticable except for very small values of redundancy.

The invention intends to remedy these drawbacks by proposing, in a single step, to determine a code work all the symbols of which belong to a 64-element sub-alphabet.

This procedure can be matched with the article "Codes between BCH and RS codes", Ch. Couvreur an, Ph. Piret, from the PHILIPS JOURNAL OF RESEARCH n°. 39, pages 195–205, published in 1984. In this article, codes of determined dimension satisfying the same constraints were suggested within the context of unequal error protection, that is to say within the context of a technical problem with no relation with the present invention.

To that end, the invention relates, according to a first aspect, to a coding device supplying code words, the symbols of which are capable of modulating a physical quantity on a transmission channel making use of symbols of a first alphabet, the decoding of these code words using symbols of a second alphabet containing the first alphabet, the cardinal of the second alphabet being strictly greater than that of the first alphabet and not being an integer power of the cardinal of the first alphabet, a device characterised in that it has:

an input of "primary" symbols belonging to the first alphabet;

processing means adapted to:

determine redundant symbols capable of allowing decoding of the code words composed of primary symbols and redundant symbols, by a decoder working on the second alphabet;

solve a system of equations expressing the constraints to be met so that the said redundant symbols are in the first alphabet.

an output of the symbols of the code words.

Correlatively, the present invention relates, according to a second aspect, to a coding method supplying code words, the symbols of which are capable of modulating a physical quantity on a transmission channel making use of symbols of a first alphabet, the decoding of these code words using symbols of a second alphabet containing the first alphabet, the cardinal of the second alphabet being strictly greater than that of the first alphabet and not being an integer power of the cardinal of the first alphabet, a method characterised in that it has:

a step of inputting "primary" symbols belonging to the first alphabet;

a step of determining redundant symbols capable of allowing decoding of the code words formed from primary symbols and redundant symbols, by a decoder working on a second alphabet including the first alphabet and symbols not belonging to the first alphabet having an operation of solving a system of equations expressing the constraints to be met so that the redundant symbols are in the first alphabet;

a step of outputting the symbols of the code words.

According to a third aspect, the invention relates to a coding device supplying code words, the symbols of which are capable of modulating a physical quantity on a transmission channel making use of symbols of a first alphabet, the decoding of these code words using symbols of a second alphabet containing the first alphabet, the cardinal $A_2$ of the second alphabet being strictly greater than the cardinal $A_1$ of the first alphabet and not being an integer power of $A_1$, both $A_1$ and $A_2$ being powers of 2, a device characterised in that it has:

an input of "primary" symbols belonging to the first alphabet;

processing means adapted to replace part of the primary symbols by symbols representative of these primary symbols, the said part containing a number of bits equal to

[c. $Log_2$ ($A_1$)–r]. $Log_2$ ($A_2$), where:

c is the number of cyclotomic classes where there exist roots of the code over the second alphabet, and r is the number of such roots, and determine redundant symbols capable of allowing decoding of the code words formed from primary symbols and redundant symbols, by a decoder working on the second alphabet by solving a system of equations expressing the constraints to be met so that the said redundant symbols are in the first alphabet, and an output of the symbols of the code words.

According to a fourth aspect, the present invention relates to a coding method supplying code words, the symbols of which are capable of modulating a physical quantity on transmission channel making use of symbols of a first alphabet, the decoding of these code words using symbols of a second alphabet containing the first alphabet, the cardinal $A_2$ of the second alphabet being strictly greater than the cardinal $A_1$ of the first alphabet and not being an integer power of $A_1$, both $A_1$ and $A_2$ being powers of 2, a method characterised in that it has:

an step of inputting "primary" symbols belonging to the first alphabet;

a step of replacing part of the primary symbols by symbols representative of these primary symbols, the said part containing a number of bits equal to

[c. $Log_2$ ($A_1$)–r]. $Log_2$ ($A_2$), where:

c is the number of cyclotomic classes where there exist roots of the code over the second alphabet, and r is the number of such roots, and determining redundant symbols capable of allowing decoding of the code words formed from primary symbols and redundant symbols, by a decoder (20) working on the second alphabet said step having an operation of solving a system of equations expressing the constraints to be met so that the said redundant symbols are in the first alphabet, and a step of outputting the symbols of the code words.

By virtue of these provisions, by solving the system of equations expressing the constraints that the symbols to be coded and the redundant symbols are all in the first alphabet, the redundant symbols are determined without having to follow an empirical testing and checking procedure.

Since the transmission of the code words uses a channel making use of the symbols of the first alphabet, and the decoding of the code words uses symbols of the second alphabet including the first alphabet, no labelling of the symbols of the first alphabet in the second alphabet is necessary.

According to a fifth aspect, the present invention relates to a decoding device, characterised in that it has:

an input of symbols of a first alphabet used on a transmission channel, and a decoding means adapted to decode symbols of a second alphabet containing the first alphabet, the cardinal of the second alphabet being strictly greater than that of the first alphabet and not being an integer power of the cardinal of the first alphabet, the symbols of the second alphabet being, at the input of the decoding means, composed of the juxtaposition of symbols of the first alphabet and predetermined symbols.

Correlatively, according to a sixth aspect, the present invention relates to a decoding method, characterised in that it has:

a step of inputting symbols of a first alphabet used on a transmission channel, and a decoding step, during which symbols of a second alphabet containing the first alphabet are decoded, the cardinal of the second alphabet being strictly greater than that of the first alphabet and not being an integer power of the cardinal of the first alphabet, the symbols of the second alphabet decoded during the decoding step being composed of the juxtaposition of symbols of the first alphabet and predetermined symbols.

The present invention also relates to a sending system, characterised in that it has a coding device as briefly disclosed above and a means of sending a signal modulating the said physical quantity representing symbols of the code words generated by the said coding device.

The present invention also relates to a computer and a capture device having a sensor, characterised in that it has a coding device as briefly disclosed above.

The present invention also relates to a receiving system, characterised in that it has a decoding device as briefly explained above and a means of receiving signals from the transmission channel.

The present invention also relates to an information storage means which can be read by a computer or a microprocessor, storing instructions of a computer program characterised in that it enables the coding method as briefly disclosed above.

The present invention also relates to an information storage means which can be read by a computer or a microprocessor, storing instructions of a computer program characterised in that it enables the decoding method as briefly disclosed above.

Since the advantages of the decoding device and method and of the sending systems, computer, capture device and receiving system are the same as those of the coding device, these advantages are not repeated here.

BRIEF DESCRIPTION OF THE DRAWINGS

The invention will be better understood from a reading of the description which follows, written with reference to the accompanying drawings in which.

DETAILED DESCRIPTION OF THE INVENTION

Figure 1:
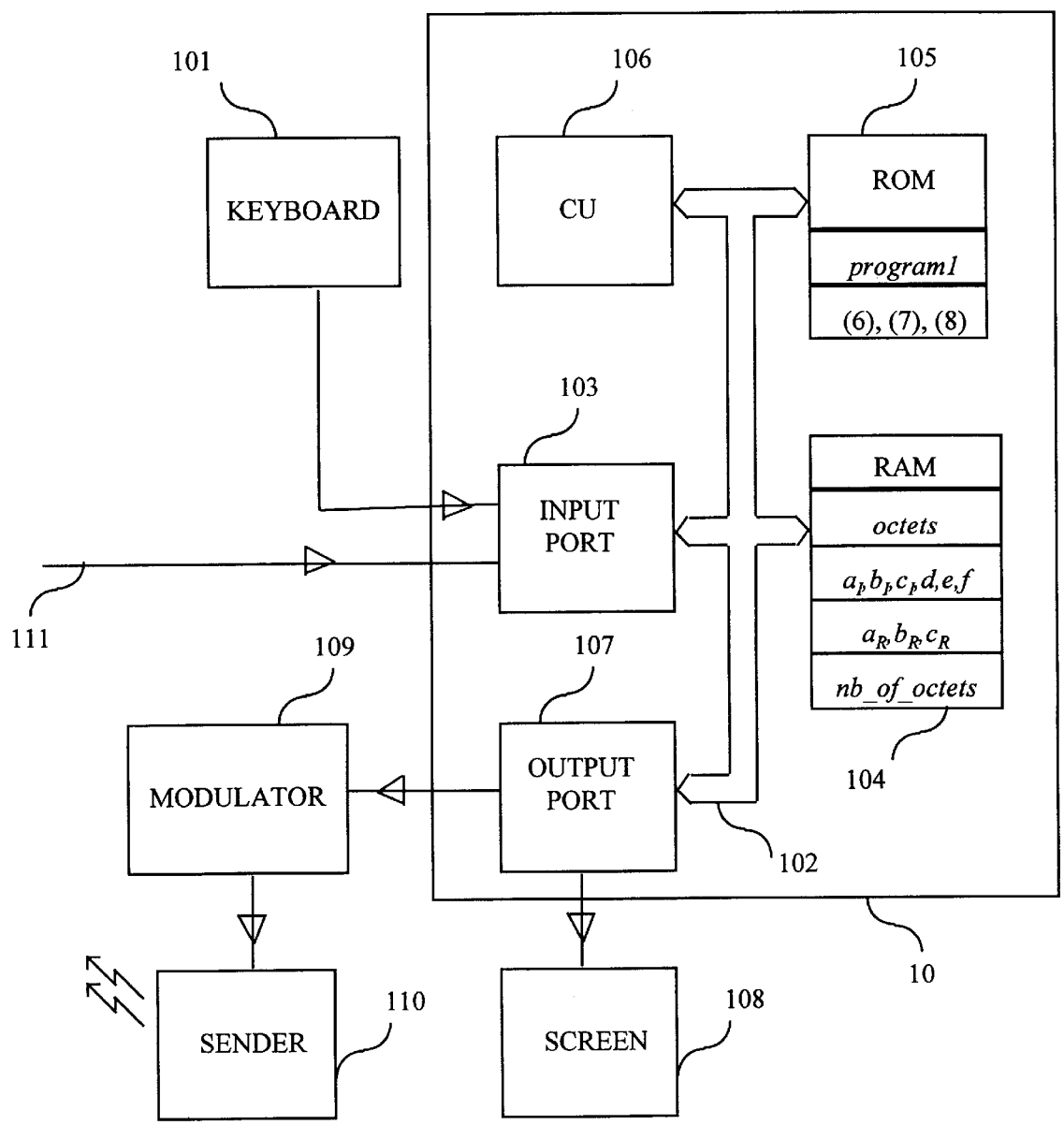
FIG. 1 depicts a coding and sending device according to the present invention.

Before starting the description of the coding and sending device illustrated in FIG. 1, it is essential to explain the theoretical foundations which guarantee the quality of operation of this device.

Each element of a 256-element Galois field can be labelled by a 7th degree polynomial in $\alpha$ having binary coefficients. Multiplication in this Galois field can then be performed by taking into account the equation $\alpha^8 = \alpha^4 + \alpha^3 + \alpha^2 + 1$. A Reed-Solomon code, can then be defined by a control matrix H such that:

$$H = \begin{vmatrix} 1 & \alpha & \alpha^2 & \ldots & \alpha^{(n-1)} \\ 1 & \alpha^2 & \alpha^4 & \ldots & \alpha^{2(n-1)} \\ \ldots & \ldots & \ldots & \ldots & \ldots \\ 1 & \alpha^r & \alpha^{2r} & \ldots & \alpha^{r(n-1)} \end{vmatrix} \quad (1)$$

a formula in which the integer n is less than or equal to 255 and represents the number of symbols in the code words.

In the language of coding theory, such a code is said to have r roots, which are the elements $\alpha^i$ of $GF(2^8)$ with $i=1, \ldots, r$. The integers between 0 and 254, included, can be classified into classes of type:

$\{1, 2, 4, 8, 16, 32, 64, 128\}$, $\{3, 6, 12, 24, 48, 96, 192, 129\}$, $\{5, 10, 20, 40, 80, 160, 65, 130\}, \ldots$ $\{17, 34, 68, 136\}$.

$\ldots$, and $\{127, 254, 253, 251, 247, 239, 223, 191\}$.

In each such class, any element is obtained as the residue modulo 255, of two times the element preceding it.

The exponents i of the elements $\alpha a^i$ in $GF(2^8)$ such that $\alpha^i$ is a root of the Reed-Solomon code are in some of these classes. These classes containing at least one exponent i of the elements $\alpha^i$ in $GF(2^8)$ such that $a^i$ is a root of the Reed-Solomon code will be called the cyclotomic classes of the Reed-Solomon code. In the sequel, the number of cyclotomic classes of a Reed-Solomon code will be denoted by c.

A code word is defined as a sequence $v=(v_0, v_1, v_2, \ldots, v_{n-1})$ of n symbols of the alphabet referred to as the "second alphabet" with 256 elements (octets) which satisfies the matrix equation $v.H^T=0$, $H^T$ being the transposed matrix of the matrix H:

$$H^T = \begin{vmatrix} 1 & 1 & \ldots & 1 \\ \alpha & \alpha^2 & \ldots & \alpha^r \\ \alpha^2 & \alpha^4 & \ldots & \alpha^{2r} \\ \ldots & \ldots & \ldots & \ldots \\ \alpha^{(n-1)} & \alpha^{2(n-1)} & \ldots & \alpha^{r(n-1)} \end{vmatrix} \quad (2)$$

The minimum distance of such a code is equal to r+1. This code therefore makes it possible to correct 3 number of errors equal to the largest integer equal at most to r/2.

Each element of a 64-element constellation, such as that of the 64-element quadrature amplitude modulation, known under the names 64-QAM, can be labelled by a 5th degree polynomial with binary coefficients. The interest here is with those 5th degree binary polynomials which form both a labelling of the 64-QAM constellation elements and a sub-alphabet, referred to as the "first alphabet", having 64 elements of the 256-element Galois field. Each symbol of this sub-alphabet can bit labelled by $v_l = a_l + b_l\alpha + c_l\alpha^2 + d_l\alpha^3 + e_l\alpha^4 + f_l\alpha^5$.

Under these conditions, the equation $v.H^T=0$ becomes, for the code words having n symbols of the sub-alphabet:

$$[1 \ \alpha \ \alpha^2 \ \alpha^3 \ \alpha^4 \ \alpha^5] \quad (3)$$

$$\begin{vmatrix} a_0 & \ldots & a_{n-1} \\ b_0 & \ldots & b_{n-1} \\ c_0 & \ldots & c_{n-1} \\ d_0 & \ldots & d_{n-1} \\ e_0 & \ldots & e_{n-1} \\ f_0 & \ldots & f_{n-1} \end{vmatrix} \begin{vmatrix} 1 & 1 & \ldots & 1 \\ \alpha & \alpha^2 & \ldots & \alpha^r \\ \alpha^2 & \alpha^4 & \ldots & \alpha^{2r} \\ \ldots & \ldots & \ldots & \ldots \\ \ldots & \ldots & \ldots & \ldots \\ \alpha^{(n-1)} & \alpha^{2(n-1)} & \ldots & \alpha^{r(n-1)} \end{vmatrix} = 0$$

an equation in which all the coefficients $a_0 \ldots a_{n-1}, b_0 \ldots b_{n-1}, c_0 \ldots c_{n-1}, d_0 \ldots d_{n-1}, e_0 \ldots e_{n-1}, f_0 \ldots f_{n-1}$ are binary.

Noting now:

$a(x) = a_0 + a_1 x + a_2 x^2 \ldots + a_{n-1} x^{n-1}$, $b(x) = b_0 + b_1 x + b_2 x^2 \ldots + b_{n-1} x^{n-1}$, $c(x) = c_0 + c_1 x + c_2 x^2 \ldots + c_{n-1} x^{n-1}$, $d(x) = d_0 + d_1 x + d_2 x^2 \ldots + d_{n-1} x^{n-1}$, $$e(x)=e_0+e_1x+e_2x^2 \ldots +e_{n-1}x^{n-1}, \text{ and}$$

$$f(x)=f_0+f_1x+f_2x^2 \ldots +f_{n-1}x^{n-1}, \quad (4)$$

equation (3) becomes:

$$[1 \ \alpha \ \alpha^2 \ \alpha^3 \ \alpha^4 \ \alpha^5 \,] \begin{vmatrix} a(\alpha) & a(\alpha^2) & \ldots & a(\alpha^r) \\ b(\alpha) & b(\alpha^2) & \ldots & b(\alpha^r) \\ \ldots & \ldots & \ldots & \ldots \\ f(\alpha) & f(\alpha^2) & \ldots & f(\alpha^r) \end{vmatrix} = 0 \quad (5)$$

It should be noted that the six polynomials a(x) to f(x) are of degree less than or equal to n−1.

In (3), each column of the matrix $H^T$ specifies eight binary conditions to be satisfied by the set of six polynomials with binary coefficients, a(x), . . . , f(x). Solving of equation (3) therefore makes it possible to calculate eight times r units of binary redundant information to be distributed in these six polynomials when the other units of binary information are specified by the information to be transmitted.

For a particular case of the value of r equal to 6, and adding the definitions of $a_R$, $a_I$, $b_R$, $b_I$, $c_R$ and $c_I$, given by:

$$a(x)=a_R(x)+a_I(x),$$

the formal degree of the polynomial $a_R(x)$ being equal to 23 and the lowest power coefficient of $a_I(x)$ capable of being non-zero being that of $x^{24}$, $$b(x)=b_R(x)+b_I(x),$$

the formal degree of the polynomial $b_R(x)$ being equal to 15 and the lowest power coefficient of $b_I(x)$ capable of being non-zero being that of $x^{16}$, and $$c(x)=c_R(x)+C_I(x),$$

the formal degree of the polynomial $c_R(x)$ being equal to 7 and the lowest power coefficient of $c_I(x)$ capable of being non-zero being that of $x^8$, it can be demonstrated that solving the matrix equation (5) amounts to solving the following three matrix equations:

$$[a_R(\alpha)b_R(\alpha)c_R(\alpha)] \quad (6)$$

$$\begin{vmatrix} 1 & 1 & 1 \\ \alpha & \alpha^{128} & \alpha^{64} \\ \alpha^2 & \alpha & \alpha^{128} \end{vmatrix} = [a_1(\alpha)b_1(\alpha)c_1(\alpha)d(\alpha)e(\alpha)f(\alpha)] \cdot G_1$$

$$\text{where } G_1 = \begin{vmatrix} 1 & 1 & 1 \\ \alpha & \alpha^{128} & \alpha^{64} \\ \alpha^2 & \alpha & \alpha^{128} \\ \alpha^3 & \alpha^{129} & \alpha^{192} \\ \alpha^4 & \alpha^2 & \alpha \\ \alpha^5 & \alpha^{130} & \alpha^{65} \end{vmatrix}$$

-continued $$[a_R(\alpha^3)b_R(\alpha^3)]\begin{vmatrix} 1 & 1 \\ \alpha & \alpha^{128} \end{vmatrix} = [a_1(\alpha^3)b_1(\alpha^3)c(\alpha^3)d(\alpha^3)e(\alpha^3)f(\alpha^3)] \cdot G_2 \quad (7)$$

$$\begin{vmatrix} 1 & 1 \\ \alpha & \alpha^{128} \end{vmatrix} \text{where } G_2 = \begin{vmatrix} \alpha^2 & \alpha \\ \alpha^3 & \alpha^{129} \\ \alpha^4 & \alpha^2 \\ \alpha^5 & \alpha^{130} \end{vmatrix}, \text{ and}$$

$$[a_R(\alpha^5)] = [a_1(\alpha^5)b(\alpha^5)c(\alpha^5)d(\alpha^5)e(\alpha^5)f(\alpha^5)] \cdot G_3 \text{ where } G_3 = \begin{vmatrix} 1 \\ \alpha \\ \alpha^2 \\ \alpha^3 \\ \alpha^4 \\ \alpha^5 \end{vmatrix} \quad (8)$$

In these equations, the units of binary information to be coded will be represented by the binary coefficients of the polynomials $a_I$, $b_I$, and $c_I$, d, e, f and the units of binary redundant information will be represented by the binary coefficients of the polynomials $a_R$, $b_R$ and $c_R$. It should be noted that there are here 48 units of binary redundant information, the polynomials $a_R$, $b_R$ and $c_R$ having respectively 24, 16 and 8 coefficients.

Consequently, the encoder will have to deduce the last three polynomials $a_R$, $b_R$ and $c_R$ from the coefficients of the first six polynomials $a_I$, $b_I$, $c_I$, d, e and f. To that end, knowing that the degree of the polynomial $c_R(x)$ is equal to 7, and that $\alpha^8=\alpha^4+\alpha^3+\alpha^2+1$, equation (6) is an equation on 7th degree polynomials and therefore mares it possible to determine the eight binary coefficients of $c_R(x)$, according to known methods.

Thus, by solving equation (6), the eight binary coefficients of the polynomial $c_R(x)$ can be determined, eight equations concerning the sixteen coefficients of $b_R(x)$ and eight equations concerning the twenty-four coefficients of $a_R(x)$.

Next, $c_R(x)$ being wholly determined, c(x) is also, and the matrix equations (6) and (7), which give respectively the values of $b_R(x)$ in $\alpha$ and $\alpha^3$, make it possible to determine the sixteen binary coefficients of $b_R(x)$. This is because, by solving equation (7), eight new equations concerning the sixteen coefficients of $b_R(x)$ are obtained, which make it possible, by solving the sixteen equations thus obtained, to determine the sixteen binary coefficients of the polynomial $b_R(x)$. By solving equation (7), eight new equations concerning the twenty-four coefficients of $a_R(x)$ are also obtained.

Next, $c_R(x)$ and $b_R(x)$ being wholly determined, c(x) and b(x) are also, and the matrix equations (6), (7) and (8), which give respectively the values of $a_R(x)$ in $\alpha$, $\alpha^3$ and $\alpha^5$, make it possible to determine the twenty-four binary coefficients of $a_R(x)$. To that end, by solving equation (8), eight new equations concerning the twenty-four coefficients of $a_R(x)$ are determined and, by solving the twenty-four equations thus obtained, the twenty-four binary coefficients of the polynomial $a_R(x)$ are determined.

According to a variant, using the following notations:

$$a(x)=a_R(x)+a_I(x),$$
$$b(x)=b_R(x)+b_I(x),$$
$$c(x)=c_R(x)+c_I(x),$$
$$d(x)=d_R(x)+d_I(x),$$
$$e(x)=e_R(x)+e_I(x),$$
$$f(x)=f_R(x)+f_I(x),$$

in which $a_f(x)$, $b_f(x)$, $c_f(x)$, $d_f(x)$, $e_f(x)$ and $f_f(x)$ are polynomials whose lowest degree coefficients which can be non-zero correspond to degree 24, and $a_R(x)$, $b_R(x)$, $c_R(x)$, $d_R(x)$, $e_R(x)$ and $f_R(x)$ are polynomials of formal degree 23, $m_1(x) = x^8 + x^4 + x^3 + x^2 + 1$;

$m_3(x) = x^8 + x^6 + x^5 + x^4 + x^3 + x^2 + x + 1$;

$m_5(x) = x^0 + x^7 + x^6 + x^5 + x^4 + x + 1$;

$a^{(1)}(x)$, $a^{(3)}(x)$ and $a^{(5)}(x)$ being defined the condition:

$a_R(x) = a^{(1)}(x)\, m_3(x)\, m_5(x) + a^{(3)}(x)\, m_1(x)\, m_5(x) + a^{(5)}(x)\, m_3(x)\, m_5(x)$. $b^{(1)}(x)$, $b^{(3)}(x)$ and $b^{(5)}(x)$ being defined by the condition:

$b_R(x) = b^{(1)}(x)\, m_3(x)\, m_5(x) + b^{(3)}(x)\, m_1(x)\, m_5(x) + b^{(5)}(x)\, m_3(x)\, m_6(x)$. $c^{(1)}(x)$, $c^{(3)}(x)$ and $c^{(5)}(x)$ being defined by the condition:

$c_R(x) = c^{(1)}(x)\, m_3(x)\, m_5(x) + c^{(3)}(x)\, m_1(x)\, m_5(x) + c^{(5)}(x)\, m_3(x)\, m_5(x)$. $d^{(1)}(x)$, $d^{(3)}(x)$ and $d^{(5)}(x)$ being defined by the condition:

$d_R(x) = d^{(1)}(x)\, m_3(x)\, m_5(x) + d^{(3)}(x)\, m_1(x)\, m_5(x) + d^{(5)}(x)\, m_3(x)\, m_5(x)$. $e^{(1)}(x)$, $e^{(3)}(x)$ and $e^{(5)}(x)$ being defined by the condition:

$e_R(x) = e^{(1)}(x)\, m_3(x)\, m_5(x) + e^{(3)}(x)\, m_1(x)\, m_5(x) + e^{(5)}(x)\, m_3(x)\, m_5(x)$. $f^{(1)}(x)$, $f^{(3)}(x)$ and $f^{(5)}(x)$ being defined by the condition:

$f_R(x) = f^{(1)}(x)\, m_3(x)\, m_5(x) + f^{(3)}(x)\, m_1(x)\, m_5(x) + f^{(5)}(x)\, m_3(x)\, m_5(x)$.

$a_1^*(x) = a^{(1)}(x)\, m_3(x)\, m_5(x) + a_f(x)$ $a_3^*(x) = a^{(3)}(x)\, m_1(x)\, m_5(x) + a_f(x)$ $a_5^*(x) = a^{(5)}(x)\, m_1(x)\, m_3(x) + a_f(x)$

. . .

$f_1^*(x) = f^{(1)}(x)\, m_3(x)\, m_5(x) + f_f(x)$ $f_3^*(x) = f^{(3)}(x)\, m_1(x)\, m_5(x) + f_f(x)$ $f_5^*(x) = f^{(5)}(x)\, m_1(x)\, m_3(x) + f_f(x)$, it can be demonstrated that solving the, matrix equation (5) amounts to solving the following three matrix equations:

$$[a^{(1)}(\alpha) b^{(1)}(\alpha) c^{(1)}(\alpha)] \begin{vmatrix} 1 & 1 & 1 \\ \alpha & \alpha^{128} & \alpha^{64} \\ \alpha^2 & \alpha & \alpha^{128} \end{vmatrix} = [a_1(\alpha) b_1(\alpha) c_1(\alpha) d_1^*(\alpha) e_1^*(\alpha) f_1^*(\alpha)] \cdot G_4 \quad (9)$$

$$\text{where } G_4 = \begin{vmatrix} 1 & 1 & 1 \\ \alpha & \alpha^{128} & \alpha^{64} \\ \alpha^2 & \alpha & \alpha^{128} \\ \alpha^3 & \alpha^{129} & \alpha^{192} \\ \alpha^4 & \alpha^2 & \alpha \\ \alpha^5 & \alpha^{130} & \alpha^{65} \end{vmatrix}$$

$$[d^{(3)}(\alpha^3) e^{(3)}(\alpha^3)] \begin{vmatrix} \alpha^3 & \alpha^{128} \\ \alpha^4 & \alpha^2 \end{vmatrix} = [a_3^*(\alpha^3) b_3^*(\alpha^3) c_3^*(\alpha^3) d_1(\alpha^3) e_1(\alpha^3) f_3^*(\alpha^3)] \cdot G_5 \quad (10)$$

$$\text{where } G_5 = \begin{vmatrix} 1 & 1 \\ \alpha & \alpha^{128} \\ \alpha^2 & \alpha \\ \alpha^3 & \alpha^{129} \\ \alpha^4 & \alpha^2 \\ \alpha^5 & \alpha^{130} \end{vmatrix}, \text{ and}$$

$$\alpha^6 f^{(6)}(\alpha^5) = [a_5^*(\alpha^5) b_5^*(\alpha^5) c_5^*(\alpha^5) d_5^*(\alpha^5) e_5^*(\alpha^5) f_1(\alpha^5)] \cdot G_6 \quad (11)$$

$$\text{where } G_6 = \begin{vmatrix} 1 \\ \alpha \\ \alpha^2 \\ \alpha^3 \\ \alpha^4 \\ \alpha^5 \end{vmatrix}$$

Hereabove, the polynomials $a_R(x)$, $b_R(x)$, $c_R(x)$, . . . contain 24 binary coefficients. The number 24 is obtained as eight times the number of cyclotomic classes where are found the r=6 exponents i such that $\alpha^i$ is a root of the code.

By labelling the information symbols to be transmitted correctly, the redundancies can be labelled by the six polynomials $a^{(1)}(\alpha)$, $b^{(1)}(\alpha)$, $c^{(1)}(\alpha)$, $d^{(3)}(\alpha)$, $e^{(3)}(\alpha)$ $f^{(5)}(\alpha)$, 7th degree polynomials.

Solving equations (9), (10) and (11) then makes it possible to define these redundancies. It should be noted that the advantage of this variant is that the redundancies can be determined in parallel, independently of one another. On the other hand, this variant is not systematic for all the information symbols. The number of nonsystematically encoded information bit is actually equal to

[c. $\log_2 (A_1)$-r]. $\log_2 (A_2)$, where:
  $A_1$ is the cardinal of the first alphabet (here $A_1$=64),
  $A_2$ is the cardinal of the second alphabet (here $A_2$=256),
  c is the number of cyclotomic classes where there exist roots of the code over the second alphabet (here c=3), and
  r is the number of such roots (here r=6).

It should be noted here that, for any value of r, the number of polynomials $m_i(x)$ to be considered must be adapted accordingly. For r=6, $m_1(x)$, $m_3(x)$ and $m_5(x)$ could be considered, where $m_i(x)$ is the minimum polynomial of $\alpha^i$ and $\alpha$ is a root of $m_1(x)$ and therefore a primitive element of GF(256).

For r=18, for example, in addition to these three polynomials, the polynomials $m_7(x)$, $m_9(x)$, $m_{11}(x)$, $m_{13}(x)$, $m_{15}(x)$ and $m_{17}(x)$ will be considered. All these polynomials are of degree 8 except for the last $m_{17}(x) = x^4 + x + 1$, which is of degree 4.

In this case, $a_R(x)$ is of form a degree 67 and is written:

$a_R = a^{(1)} m_3 m_5 \ldots m_{15} m_{17} + a^{(3)} m_1 m_5 \ldots m_{17} + \ldots + a^{(15)} m_1 m_3 \ldots m_{13} m_{17} + {}^{(17)} m_1, \ldots m_{15}$ where the $a^{(i)}$'s are polynomials with binary coefficients of formal degree 7, except for $a^{(17)}$ which is of formal degree 3. As regards the coefficient of the lowest power of x which can be zero, in the expression of $a_f(x)$, it is that of $x^{68}$. Similar considerations can be made regarding the polynomials b(x), c(x), d(x), e(x) and f(x).

An embodiment of devices implementing the present invention will now be described with the help of FIGS. 1 to 4. In this embodiment, the "second alphabet" is composed of octets and the "first alphabet" is composed of octets of the second alphabet of which the two most significant units of binary information are zero. It should be noted that the cardinal of the second alphabet, 256, is not an integer power of the cardinal of the first alphabet, 64.

The coding and sending device is illustrated in block diagram form and represented under general reference 10 (FIG. 1). It has, interconnected by an address and data bus 102:

a central processing unit 106;

a random access memory RAM 104;

a read-only memory ROM 105;

an input port 103 used to receive in octet form, information which the coding and sending device is to transmit;

an output port 107 allowing the coding and sending device to transmit 6-tuples, that is to say groups of six units of binary information or "bits", representing points of a constellation; and, independently of the bus 102:

a modulator 109 performing a quadrature amplitude modulation with 64 points representing 6-tuples which come to it from the output port 107;

a sending antenna 110 which broadcasts a signal modulated by the modulator 109;

a display screen 108 connected to the output port 107;

a keyboard 101 connected to the input port 103 and supplying octets representing successively used keyboard keys; and an input 111 of data to be coded, in octet form, connected to the input port 103.

Each of the elements illustrated in FIG. 1 is well known to persons skilled in the art of computers and, more generally, information processing systems. These elements are therefore not described here.

The random access memory 104 stores data, variables and intermediate processing results, in memory registers having, in the remainder of the description, the same names as the data whose values they store. The random access memory 104 has notably:

a register "octets" which stores a series of octets to be coded and transmitted, a series which come from the data to be coded input 111, a register "no_of_octets" which stores the number of octets to be coded which have already been received, a register "$a_I$, $b_I$, $c_I$, d, e, f" which stores the binary coefficients of the polynomials $a_I(x)$, $b_I(x)$, $c_I(x)$, $d(x)$, $e(x)$, $f(x)$, and a register "$a_R$, $b_R$, $c_R$" which stores the binary coefficients of the polynomials $a_R(x)$, $b_R(x)$, $c_R(x)$.

The read-only memory 105 is adapted to store the operating program of the central processing unit 106, in a register "program1", and the data necessary for solving the equations (6), (7) and (8) in a register "(6), (7), (8)" as well as the look-up table matching units of binary information received by means of the data input 111 with the binary coefficients of the polynomials $a_I(x)$, $b_I(x)$, $c_I(x)$, $d(x)$, $e(x)$, $f(x)$.

Figure 3:
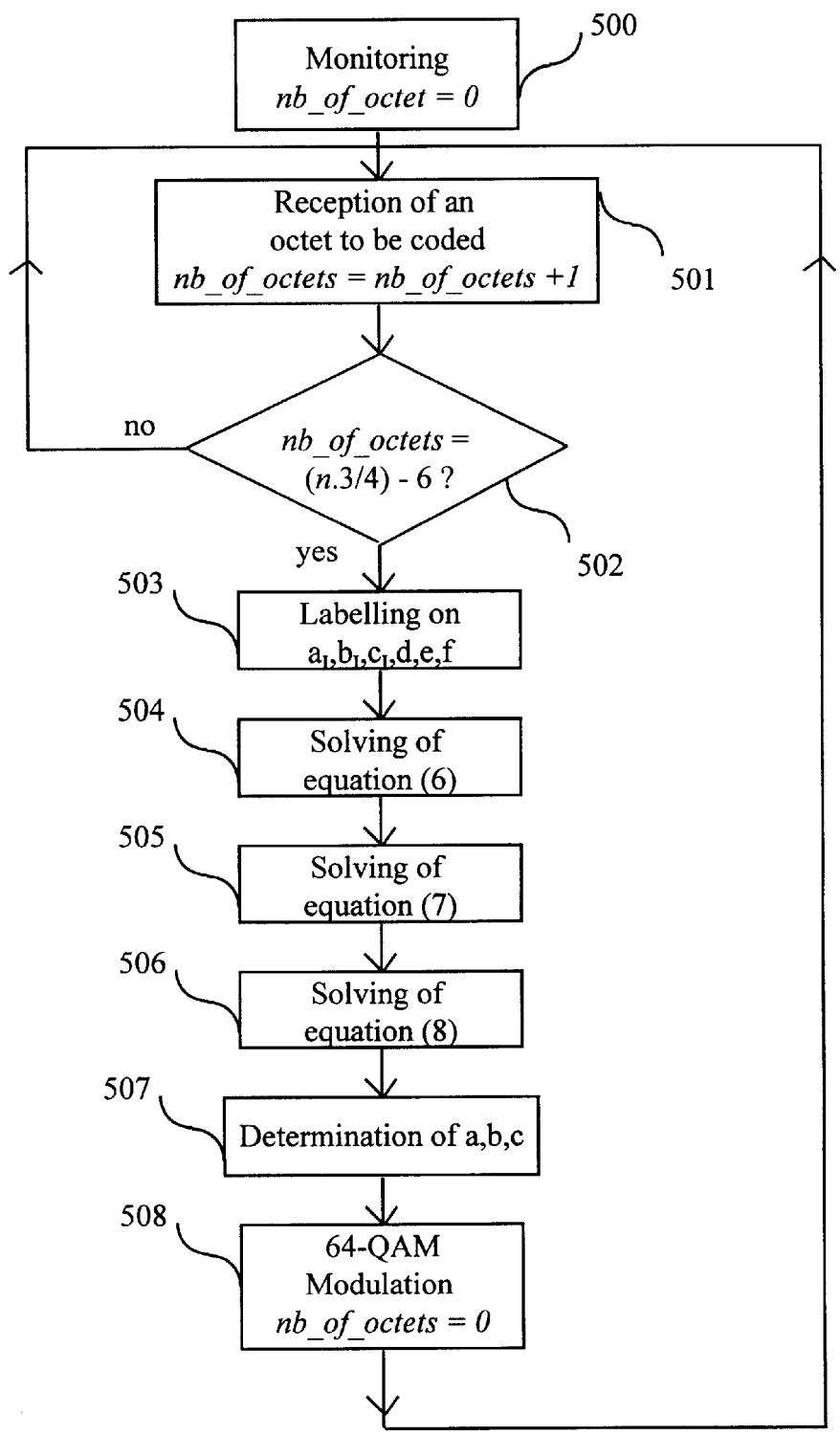
FIG. 3 depicts a flow diagram of operation of the coding and sending device illustrated in FIG. 1, and, FIG. 4 depicts a flow diagram of operation of the decoding device illustrated in FIG. 2.

The central processing unit 106 is adapted to use the flow diagram described in FIG. 3.

Figure 2:
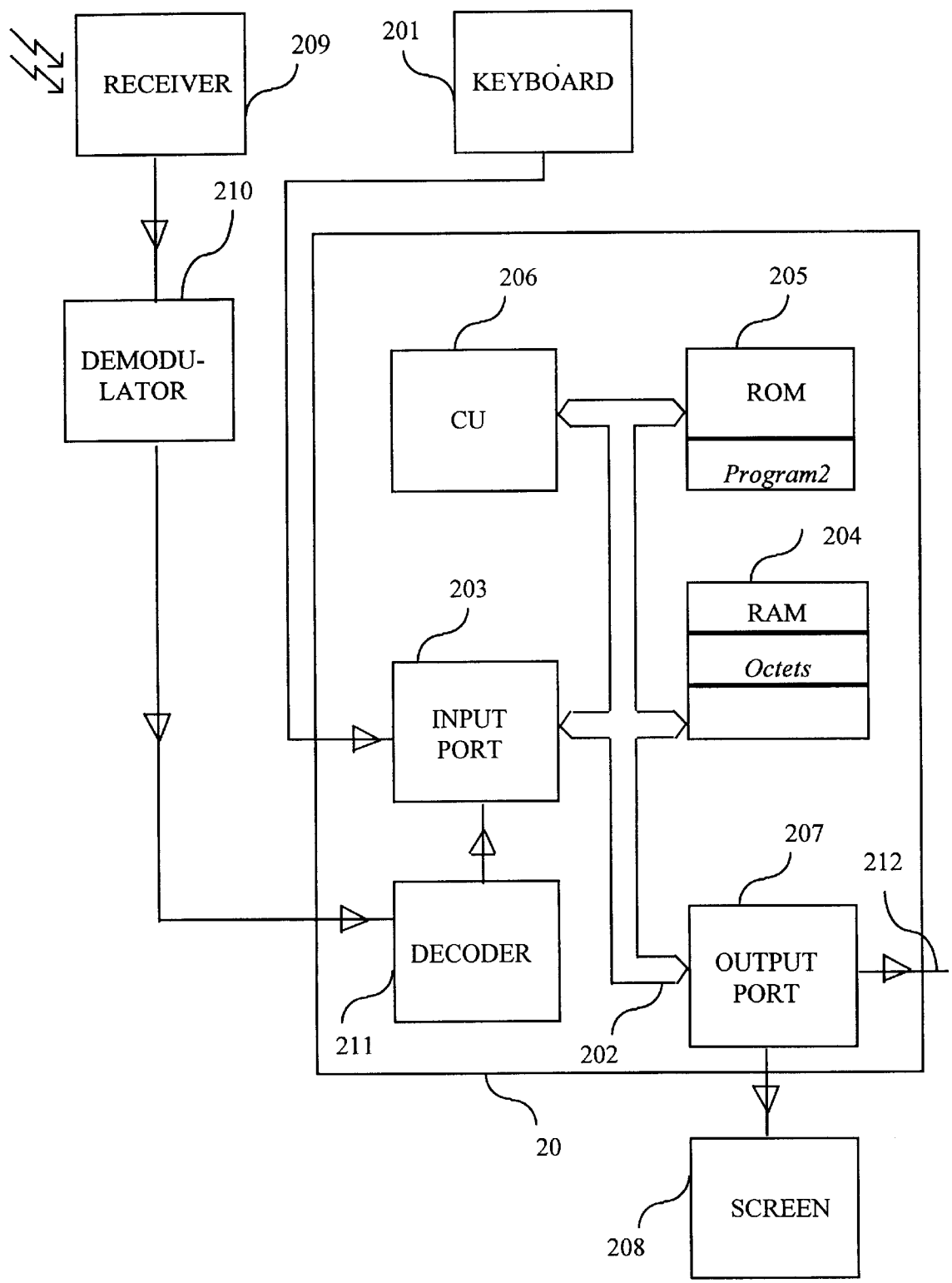
FIG. 2 depicts a receiving and decoding device according to the present invention.

The receiving and decoding device depicted in FIG. 2, under general reference 20, is illustrated in block diagram form. It has, interconnected by an address and data bus 202:

a central processing unit 206;

a random access memory RAM 204;

a read-only memory ROM 205;

an input port 203 used to receive information which the receiving and decoding device is to process, store or transmit;

an output port 207 enabling the receiving and decoding device to transmit decoded octets; and, independently of the bus 202:

a receiving antenna 209 which receives a signal representing the signal sent by the sending antenna 110 of a coding and sending device (FIG. 1);

a demodulator 210 performing a 64-point quadrature amplitude demodulation into 6-tuples;

a Reed-Solomon decoder 211 which uses a code, the words of which are composed of octets, the six least significant bits of which are the 6-tuples coming from the demodulator 210, and the two most significant bits of which are equal to zero, and supplying decoded data to the input port 203;

a display screen 208 connected to the output port 207;

a keyboard 201 connected to the input port 203; and a decoded data output 212, connected to the output port 207.

Each of the elements illustrated in FIG. 2 is well known to persons skilled in the art of information decoding systems and, more generally, information processing systems. These elements are therefore not described here.

It should be noted, however, that at the input of the Reed-Solomon decoder 211, an input which has eight wired electrical links, the six electrical links which correspond to the least significant bits are connected to six electrical links coming out of the demodulator 210, and the two electrical links which correspond to the two most significant bits are connected to the earth of the receiving and decoding device, the corresponding bits then being zero in value. These provisions achieve, at the input of the decoder 211, an assembly by juxtaposing symbols of the first alphabet (with 64 symbols) and predetermined symbols (here equal to "0"), to form symbols of the second alphabet (with 256 symbols).

The random access memory 204 stores data, variables and intermediate processing results, in memory registers having, in the remainder of the description, the same names as the data whose values they store. The random access memory 204 has notably a register "octets" which stores the series of octets decoded by the decoder 211.

The read-only memory 205 is adapted to store the operating program of the central processing unit 206, in a register "program2", as well as the look-up table matching the decoded 6-tuples, which are in fact octets of which the two most significant bits have a zero value, and the binary information of the octets which were used to generate them in the coding and sending device (FIG. 1).

It should be noted here that the receiving and decoding device depicted in FIG. 2 is entirely conventional, the only modification for processing the received symbols concerning the assembly, at the input of the decoder 211, of the binary information received in the form of 6-tuples representing signals modulated by the modulator 109, with two units of binary information of zero value, to form octets used by the decoder 211.

It should be noted that the decoding of a Reed-Solomon code described above is also achieved, in place of using the decoder 211, by providing the read-only memory 205 with a decoding program and by executing the decoding program by the central processing unit 206. The central processing unit 206 is adapted to use the flow diagram described in FIG. 4.

With reference to FIG. 3, the operation of the coding and sending device illustrated in FIG. 1 is now explained.

When this coding and sending device is set working, the value of the variable no_of_octets is set to zero. During an operation 501, the central unit 106 performs the reception of an octet to be coded, if any, on the input port 103 and increments the value of the variable no_of_octets, and the storing in the register "octets" of the random access memory 104, of this octet Next, the central unit 106 performs a test 502, during which it determines whether or not the number of octets no_of_octets already received is equal to $(n.\tfrac{3}{4})-6$.

When the result of the test 502 is negative, the operation 501 is reiterated. When the result of the test 502 is positive, the operation 503 consists of labelling, that is to say matching, units of binary information constituting the octets stored in the register "octets", with coefficients of the polynomials $a_f(x)$, $b_f(x)$, $c_f(x)$, $d(x)$, $e(x)$; $f(x)$ using the look-up table stored in the read-only memory 105 and storing, in the register "$a_f$, $b_f$, $c_f$, d, e, f" of the random access memory 104, the coefficients of these polynomials.

The operation 504 next consists of solving equation (6) and determining the eight binary coefficients of the polynomial $c_R(x)$, eight equations concerning the sixteen coefficients of $b_R(x)$ and eight equations concerning the twenty-four coefficients of $a_R(x)$.

The operation 505 consists of solving equation (7), determining eight new equations concerning the sixteen coefficients of $b_R(x)$ and, by solving the sixteen equations obtained during the operations 504 and 505 and concerning the sixteen coefficients of $b_R(x)$, determining the sixteen binary coefficients of the polynomial $b_R(x)$. The operation 505 also consists of determining eight new equations concerning the twenty-four coefficients of $a_R(x)$.

The operation 506 consists of solving equation (8), determining eight new equations concerning the twenty-four coefficients of $a_R(x)$ and, by solving the twenty-four equations obtained during the operations 604, 505 and 506 and concerning the twenty-four, coefficients of $a_R(x)$, determining the twenty-four binary coefficients of the polynomial $a_R(x)$.

The operation 507 consists of determining the 6-tuples of the coefficients of same degree of the six polynomials $a(x)$, $b(x)$, $c(x)$, $d(x)$, $e(x)$, $f(x)$ and transmitting these 6-tuples to the output port 107, bound for the modulator 109.

The operation 508 consists of performing a 64-QAM quadrature amplitude modulation, representing the 6-tuples to be transmitted. Next, the value of the variable no_of_ octets is reset to zero and the operation 501 is reiterated.

Figure 4:
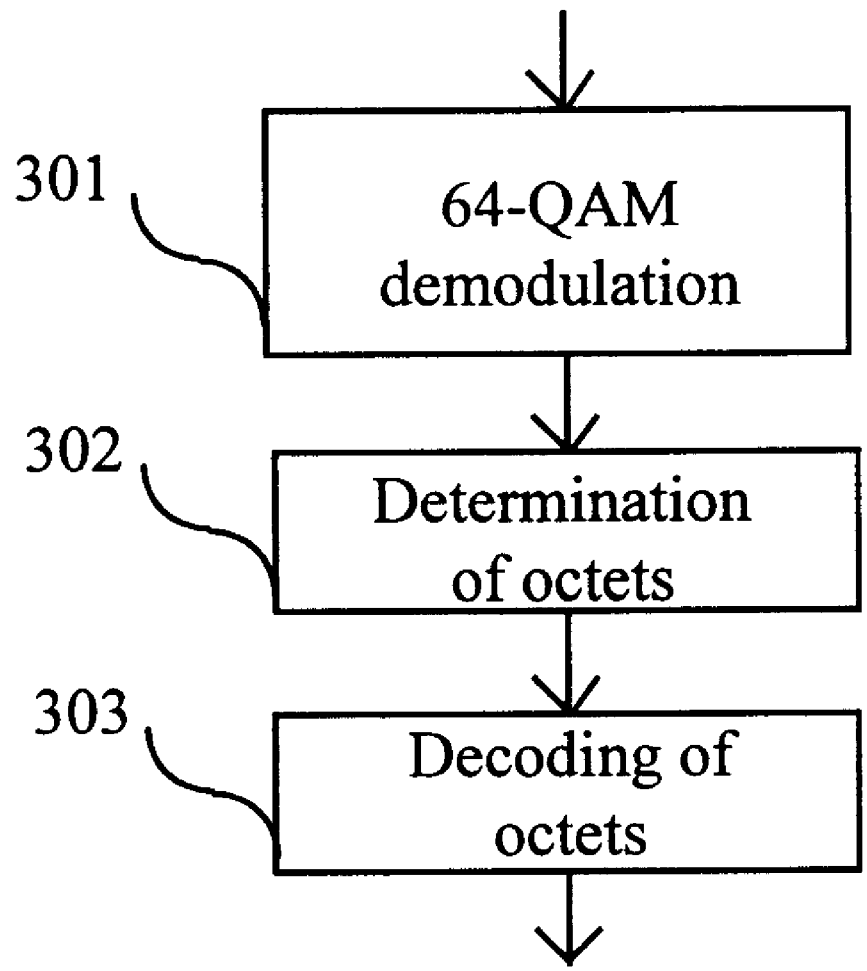

With reference to FIG. 4, the operation of the decoding device illustrated in FIG. 2 is now explained.

When this decoding device is set working, it receives signals coming from the coding and sending device illustrated in FIG. 1, this signals being modulated during step 508 (FIG. 3).

An operation 301 consist in performing a 64-QAM quadrature amplitude demodulation, by use of the demodulator 210.

An operation 302 next consists in determining the octets corresponding to the 6-tuples coming out from the demodulator. This can be achieved both:

- by hardware specific features of the recoding device illustrated on FIG. 2 (it should be recalled that at the input of the Reed-Solomon decoder 211, an input which has eight wired electrical links, the six electrical links which correspond to the least significant bits are connected to six electrical links coming out of the demodulator 210, and the two electrical links which correspond to the two most significant bits support an electrical signal corresponding to the logical value "0", and
- by the program of the central processing unit 206 (which then add two most significant bits to the 6-tuples received from the demodulator 210 and stores the resulting octets in RAM 204).

Each of these provisions achieves, at the input of the decoder 211, an assembly by juxtaposing symbols of the first alphabet (with 64 symbols) and predetermined symbols (here equal to "0"), to form symbols of the second alphabet (with 256 symbols).

An operation 303 next consists in decoding these octets according to the known Reed-Solomon decoding method acting on octets. This operation can both be performed by the decoder 211 or by a known Reed-Solomon decoding software carried out by the central processing unit 206.

The decoded octets Are then stored, during operation 303, in the register "octets" of RAM 204.

The scope of the invention is not limited to the embodiment described and depicted but on the contrary extends to the modifications and improvements within the capability of persons skilled in the art.

What is claimed is:

1. Coding device (10) supplying code words, the symbols of which are capable of modulating a physical quantity on a transmission channel making use of symbols of a first alphabet, the decoding of these ode words using symbols of a second alphabet containing the first alphabet, the cardinal of the alphabet being strictly greater than that of the first alphabet and not being an integer power of the cardinal of the first alphabet, a device characterized in that it has:

an input (103,111) of "primary symbols belonging to the first alphabet;

processing means (104, 105, 106) adapted to determined redundant symbols capable of allowing decoding of the code words formed primary symbols and redundant symbols, by a decoder (20) working on the second alphabet by solving a system of equations expressing the constraints to be met so that said redundant symbols are in the first alphabet.

an output (107) of the symbols of the code words.

2. Coding device (10) supplying code words, the symbols of which are capable of modulating a physical quantity on a transmission channel making use of symbols of a first alphabet, the decoding of these code words using symbols of a second alphabet containing the first alphabet, the cardinal $A_2$ of the second alphabet being strictly greater than the cardinal $A_1$ of the first alphabet and not being an integer power of $A_1$, both $A_1$ and $A_2$ being powers of 2, a device characterised in that it has:

an input (103, 111) of "primary" symbols belonging to the first alphabet;

processing means (104, 105, 106) adapted to replace a part of the primary symbols by symbols representative of these primary symbols, said part containing a number of bits equal to $$\{c. \operatorname{Log}_2(A_1) - r\} * \operatorname{Log}_2(A_2)_1$$

where: c is the number of cyclotomic classes where these exist roots of the code over the second alphabet, and r is the number of such roots, and determined redundant symbols capable of allowing decoding of the code words formed from primary symbols and redundant symbols, by a decoder (20) working on the second alphabet by solving a system of equations expressing the constraints to be met so that the said redundant symbols are in the first alphabet, and an output (107) of the symbols of the code words.

3. Coding device according to either one of claims 1 or 2, chracterised in that the processing means (104, 105, 106) are adapted to solve the system of equations by successively loving sub-systems of equations each having a number of unknown strictly less than the number of unknowns of the complete system of equations.

4. Coding device according to either claim 1 or 2, characterised in that the processing means (104, 105, 106) are adapted to use the second alphabet which, provided with an operation, constitutes a group, and the first alphabet which, provided with the same operation, constitutes a subgroup of the second alphabet.

5. Coding device according to claim 4, characterised in that the processing means (104, 105, 106) are adapted to use the second alphabet which, provided with two operations, constitutes a Galois field, and the first alphabet which, provided with the same two operations, does not constitute a Galois sub-field of the second alphabet.

6. Coding device according to either claim 1 or 2, characterised in that the processing means (104, 105, 106) are adapted to use a first alphabet which has 64 symbols.

7. Coding device according to either claim 1 or 2, characterised in that the processing means (104, 105, 106) are adapted to use a second alphabet which has 256 symbols.

8. Coding device according to either claim 1 or 2, characterised in that the processing means (104, 105, 106) are adapted to use a second alphabet composed of binary sequences and a first alphabet composed of binary sequences from the second alphabet, of which certain units of binary information have a predetermined value.

9. Coding device according to either claim 1 or 2, characterised in that the processing means (104, 105, 106) are adapted to supply code words which belong to a Reed-Solomon code.

10. Coding device according to either claim 1 or 2, characterised in that the processing means (104, 105, 106) are adapted to use matrix calculations.

11. Coding device according to either claim 1 or 2, characterised in that it has a modulator (109) adapted to perform a quadrature amplitude modulation.

12. Sending System, characterised in that it has a coding device (10) according to either claim 1 or 2, and means of sending (109, 110) a signal modulating the physical quantity representing symbols of the code words generated by the said coding device.

13. Computer, characterised in that it has a coding device according to either claim 1 or 2.

14. Device for capturing physical quantities having a sensor, characterised in that it has a coding device according to either claim 1 or 2.

15. Coding method supplying code words, the symbols of which are capable of modulating a physical quantity on a transmission channel making use of symbols of a first alphabet, the decoding of these code words using symbols of a second alphabet containing the first alphabet, the cardinal of the second alphabet being strictly greater than that of the first alphabet and not being an integer power of the cardinal of the first alphabet, a method characterised in that it has:
   a step of inputting (501) "primary" symbols belonging to the first alphabet;
   a step of determining (503 to 507) redundant symbols capable of allowing decoding of the code words formed from primary symbols and redundant symbols, by a decoder working on a second alphabet including the first alphabet and symbols not belonging to the first alphabet, having an operation of solving (504, 505, 506) a system of equations expressing the constraints to be met so that the redundant symbols are in the first alphabet;
   a step of outputting (508) the symbols of the code words.

16. Coding method supplying code words, the symbols of which are capable of modulating a physical quantity on a transmission channel making use of symbols of a first alphabet, the decoding of these code words using symbols of a second alphabet containing the first alphabet, the cardinal $A_2$ of the second alphabet being strictly greater than the cardinal $A_1$ of the first alphabet and not being an integer power of $A_1$, both $A_1$ and $A_2$ being powers of 2, a method characterised in that it has;
   an step of inputting (501) "primary" symbols belonging to the first alphabet;
   a step (503 to 507) of replacing a part of the primary symbols by symbols representative of these primary symbols, the replaced part containing a number of bits equal to $$\{c. \text{Log}_2 (A_1) - r\} * \text{Log}_2 (A_2),$$

where:
   c is the number of cyclotomic classes where there exist roots of the code over the second alphabet, and
   r is the number of such roots, and determining redundant symbols capable of allowing decoding of the code words formed from primary symbols and redundant symbols, by a decoder (20) working on the second alphabet said step having an operation of solving (504 to 506) a system of equations expressing the constraints to be met so that said redundant symbols are in the first alphabet, and
   a step of outputting (508) the symbols of the code words.

17. Coding method according to either one of claims 15 or 16, characterised in that, during the operation of solving the said system of equations, steps (504, 505, 506) are successively performed for solving sub-systems of equations each having a number of unknowns strictly less than the number of unknowns of the complete system of equations.

18. Coding method according to either claim 15 or 16, characterised in that it uses the second alphabet which, provided with an operation, constitutes a group, and the first alphabet which, provided with the same operation, constitutes a sub-group of the second alphabet.

19. Coding method according to claim 18, characterised in that it uses the second alphabet which, provided with two operations, constitutes a Galois field, and the first alphabet which, provided with the same two operations, does not constitute a Galois sub-field of the second alphabet.

20. Coding method according to either claim 15 or 16, characterised in that it uses a first alphabet which has 64 symbols.

21. Coding method according to either claim 15 or 16, characterised in that it uses a second alphabet which has 256 symbols.

22. Coding method according to either claim 15 or 16, characterised in that the second alphabet is composed of binary sequences and the first alphabet is composed of binary sequences from the second alphabet, of which certain units of binary information have a predetermined value.

23. Coding method according to either claim 15 or 16, characterised in that the code words belong to a Reed-Solomon code.

24. Coding method according to either claim 15 or 16, characterised in that, during the determination operation (504, 505, 506), matrix calculations are used.

25. Decoding device, characterised in that it has:
   an input (209, 210) of symbols of a first alphabet used on a transmission channel, and
   a decoding means (211) adapted to decode symbols of a second alphabet containing the first alphabet, the cardinal of the second alphabet being strictly greater than that of the first alphabet and not being an integer power of the cardinal of the first alphabet, the symbols of the second alphabet being, at the input of the decoding means, composed of the juxtaposition of symbols of the first alphabet and predetermined symbols.

26. Decoding device according to claim 25, characterised in that the transmission channel is adapted to use a first alphabet which has 64 symbols.

27. Decoding device according to claim 25, characterised in that the decoding means (211) is adapted to use a second alphabet which has 256 symbols.

28. Decoding device according to claim 25, characterised in that the decoding means (211) is adapted to decode words of a Reed-Solomon code.

29. Decoding device according to claim 25, characterised in that it has a demodulator (210) adapted to perform a quadrature amplitude demodulation of signals transmitted on the transmission channel.

30. Receiving system, characterised in that it has a decoding device according to claim 25 and a means of receiving (209, 210) signals from the transmission channel.

31. Decoding method, characterised in that it has:
- a step of inputting symbols of a first alphabet used on a transmission channel, and
- a decoding step, during which symbols of a second alphabet containing the first alphabet are decoded, the cardinal of the second alphabet being strictly greater than that of the first alphabet and not being an integer power of the cardinal of the first alphabet,
- the symbols of the second alphabet decoded during the decoding step being composed of the juxtaposition of symbols of the first alphabet and predetermined symbols.

32. Decoding method according to claim 31, characterised in that, during the inputting step, a first alphabet which has 64 symbols is used.

33. Decoding method according to claim 31, characterised in that, during the decoding step, a second alphabet which has 256 symbols is used.

34. Decoding method according to claim 31, characterised in that, during the decoding step, words of a Reed-Solomon code are decoded.

35. Information storage means which can be read by a computer or a microprocessor, storing instructions of a computer program characterised in that it enables the method according to either claim 15 or 16 to be implemented.

36. Information storage means which can be read by a computer or a microprocessor, storing instructions of computer program characterised in that it enables the method according to claim 31 to be implemented.

* * * * *

UNITED STATES PATENT AND TRADEMARK OFFICE
CERTIFICATE OF CORRECTION

PATENT NO. : 6,393,065 B1
DATED : May 21, 2002
INVENTOR(S) : Piret et al.

It is certified that error appears in the above-identified patent and that said Letters Patent is hereby corrected as shown below:

Title page,
Item [57], ABSTRACT,
Line 1, "supplied" should read -- supplies --.

Column 1,
Line 12, "Particularly" should read -- particularly --.
Line 31, "distinction:" should read -- distinction --.

Column 2,
Line 36, "optimised," should read -- optimized, --.
Line 52, "an," should read -- and --.

Column 4,
Line 7, "an" should read -- a --.

Column 6,
Line 7, "$\alpha a^1$" should read -- $\alpha^1$ --.
Line 11, "will" should read -- and will --.
Line 30, "3" should read -- a --.
Line 40, "$v_i = a_i + b_i\alpha + c_i\alpha^2 + d_i\alpha^3 + e_i\alpha^4 + f_i\alpha^5.$" should read
-- $v_i = a_i + b_i\alpha + c_i\alpha^2 + d_i\alpha^3 + e_i\alpha^4 + f_i\alpha^5.$ --.

Column 7,
Equation (3), "$a(\alpha')$" should read -- $a(\alpha^r$ --, and "$b(\alpha')$" should read -- $b(\alpha^r$ --.

Column 8,
Line 33, "mares" should read -- makes --.

Column 9,
Line 11, "$b^{(1)}(x),$" should begin a new paragraph.
Line 14, "$c^{(1)}(x),$" should begin a new paragraph.
Line 17, "$d^{(1)}(x),$" should begin a new paragraph.
Line 20, "$e^{(1)}(x),$" should begin a new paragraph.
Line 23, "$f^{(1)}(x),$" should begin a new paragraph.

Column 10,
Line 16, "$\alpha^1$" should read -- $\alpha^i$ --.
Line 18, "$e^{(3)}(\alpha)$" should read -- $e^{(3)}(\alpha),$ --.

UNITED STATES PATENT AND TRADEMARK OFFICE
CERTIFICATE OF CORRECTION

PATENT NO. : 6,393,065 B1
DATED : May 21, 2002
INVENTOR(S) : Piret et al.

It is certified that error appears in the above-identified patent and that said Letters Patent is hereby corrected as shown below:

Column 12,
Line 64, "octet" should read -- octet. --.

Column 13,
Line 6, "e(x);" should read -- e(x), --.

Column 14,
Line 6, "Are" should read -- are --.
Line 16, "ode" should read -- code --.
Line 18, "alphabet" should read -- second alphabet --.
Line 21, " "primary" should read -- "primary" --.
Line 23, "determined" should read -- determine --.
Line 25, "formed" should read -- formed from --.
Line 29, "alphabet." should read -- alphabet; --.
Line 49, "these" should read -- there --.
Line 52, "and" should begin a new paragraph.
Line 63, "loving" should read -- solving --.
Line 64, "unknown" should read -- unknowns --.

Column 15,
Line 3, "subgroup" should read -- sub-group --.
Line 32, "System," should read -- system, --.
Line 60, "alphabet;" should read -- alphabet; and --.

UNITED STATES PATENT AND TRADEMARK OFFICE
CERTIFICATE OF CORRECTION

PATENT NO.   : 6,393,065 B1
DATED        : May 21, 2002
INVENTOR(S)  : Piret et al.

It is certified that error appears in the above-identified patent and that said Letters Patent is hereby corrected as shown below:

<u>Column 16,</u>
Line 4, "has;" should read -- has: --.
Line 5, "an" should read -- a --.
Line 16, "and" should begin a new paragraph.
Line 20, "alphabet" should read -- alphabet, --.

Signed and Sealed this

Fifteenth Day of April, 2003

JAMES E. ROGAN
*Director of the United States Patent and Trademark Office*